(12) United States Patent
McAllister et al.

(10) Patent No.: US 6,252,391 B1
(45) Date of Patent: *Jun. 26, 2001

(54) HIGH FREQUENCY PROBE

(75) Inventors: Michael F. McAllister, Clintondale, NY (US); Klaus K. Kempter, Holzgerlingen (DE); Charles F. Pells, Wappingers Falls, NY (US); Stephan R. Richter, Boeblingen; Gerhard Ruehle, Sommerhofenstrasse, both of (DE)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,907

(22) Filed: Aug. 28, 1998

(51) Int. Cl.⁷ ..................................... G01R 1/06
(52) U.S. Cl. ........................... 324/149; 324/72.5
(58) Field of Search .................. 324/761, 754, 324/755, 72.5, 149, 220, 159, 550, 758; 439/296, 298, 299

(56) References Cited

U.S. PATENT DOCUMENTS

| | | | |
|---|---|---|---|
| 3,315,163 | * 4/1967 | Lutz | 324/149 |
| 3,826,981 | * 7/1974 | Ross | 234/72.5 |
| 3,829,776 | * 8/1974 | Lozoya | 324/122 |
| 4,151,462 | * 4/1979 | Teyler | 324/72.5 |
| 4,464,623 | * 8/1984 | Chambon | 324/72.5 |
| 4,491,788 | * 1/1985 | Zandonatti | 324/72.5 |
| 4,710,710 | * 12/1987 | Flora et al. | 324/220 |
| 4,740,746 | * 4/1988 | Pollock et al. | 324/761 |
| 4,783,625 | * 11/1988 | Harry et al. | 324/761 |
| 4,923,407 | * 5/1990 | Rice et al. | 439/92 |
| 5,001,422 | 3/1991 | Dahlberg et al. | 324/158 |
| 5,101,151 | 3/1992 | Beaufils et al. | 324/550 |
| 5,251,150 | 10/1993 | Ladner et al. | 364/550 |
| 5,254,944 | * 10/1993 | Holmes et al. | 324/220 |
| 5,293,122 | * 3/1994 | Cake et al. | 324/761 |
| 5,389,874 | 2/1995 | King et al. | 324/758 |
| 5,565,788 | * 10/1996 | Burr et al. | 324/762 |
| 5,703,494 | 12/1997 | Sano | 324/761 |
| 5,717,328 | * 2/1998 | Kerr et al. | 324/149 |
| 5,789,911 | * 8/1998 | Brass | 324/72.5 |
| 5,834,929 | * 11/1998 | Dietz | 324/72.5 |
| 5,939,890 | * 8/1999 | Kohen et al. | 324/754 |

* cited by examiner

Primary Examiner—Glenn W. Brown
Assistant Examiner—Vincent Q Nguyen
(74) Attorney, Agent, or Firm—Floyd Gonzalez; Cantor Colburn LLP

(57) ABSTRACT

A high frequency probe is presented. The probe comprises a probe body having a coaxial resilient double ended probe element attached thereto by an adaptor. A locking pin is attached to the probe adaptor and extends parallel to the probe element, however, it is slightly shorter as the locking pin should not contact any pins of the device being probed. The locking pin serves to hold the probe in place. Alternatively, a high frequency differential probe is presented. The high frequency differential probe comprises a base having a first pair of opposing spring steel plates and a second adjacent pair of opposing spring steel plates connected thereto. The first pair of spring plates are also connected to a first probe adaptor and the second pair of spring plates are also connected to a second probe adaptor. A first probe body is mounted at an angle to the first adaptor and a second probe body is mounted at an angle to the second adaptor. A first coaxial resilient double ended probe element connected to the first probe body by the first adaptor and a second coaxial resilient double ended probe element connected to the second probe body by the second adaptor.

11 Claims, 5 Drawing Sheets

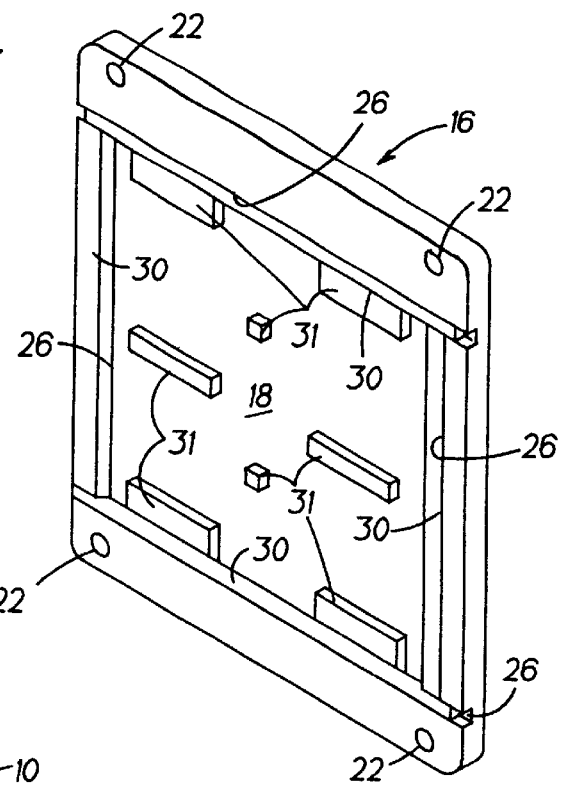
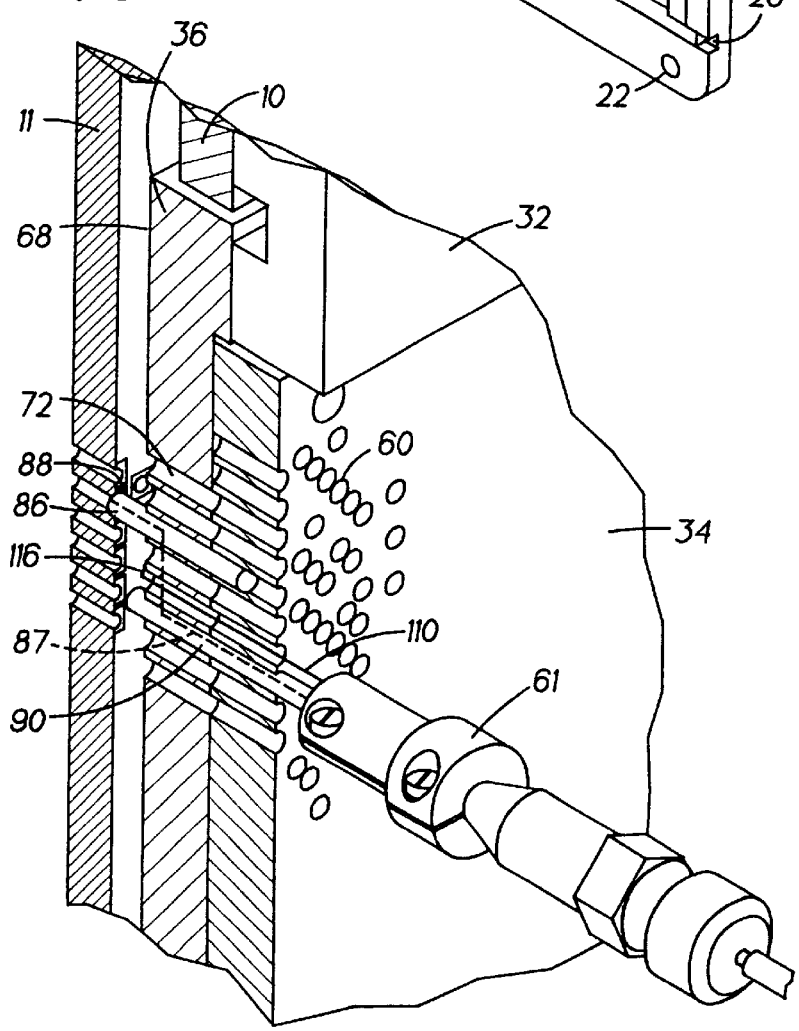

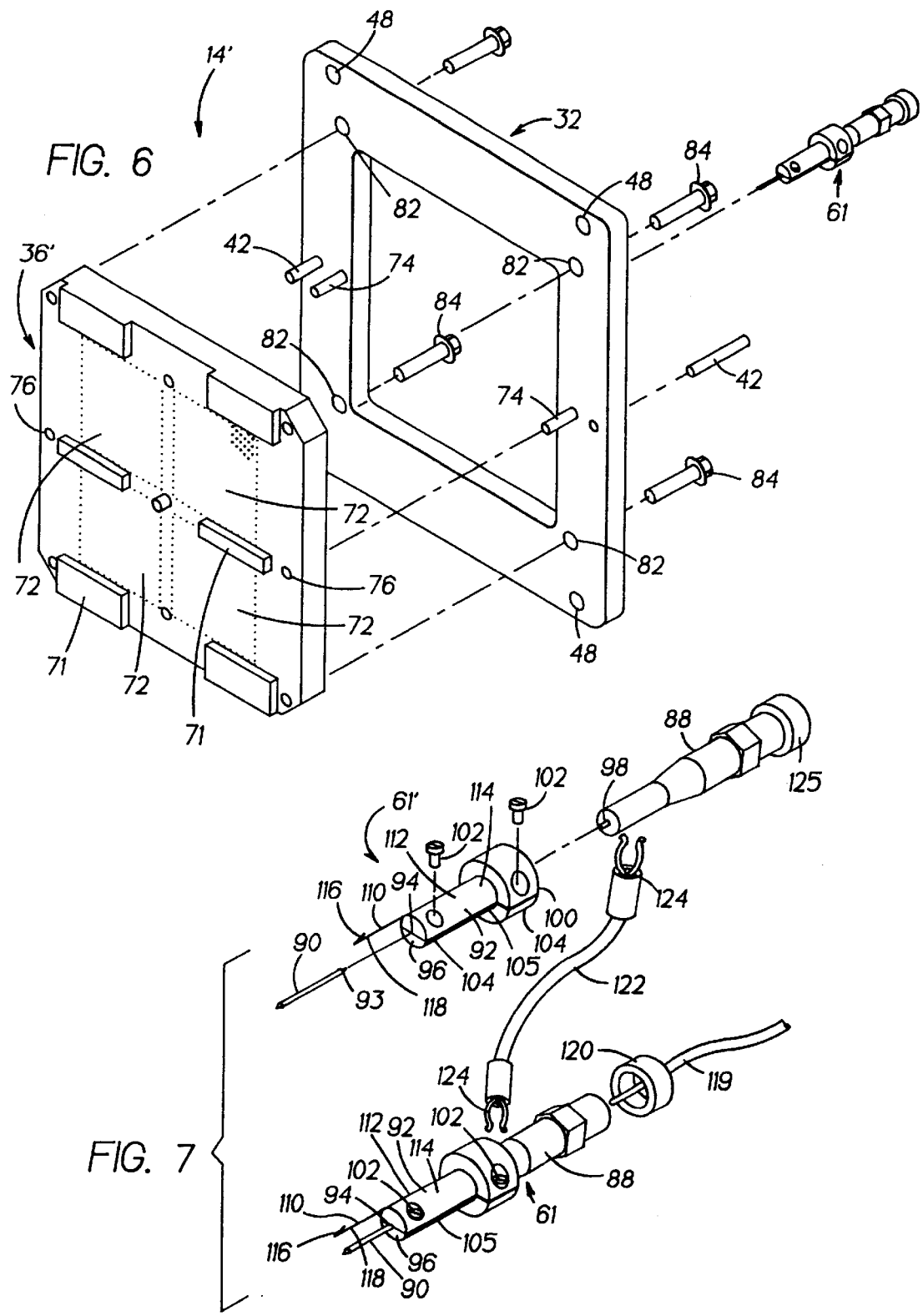

HIGH FREQUENCY PROBE

BACKGROUND OF THE INVENTION

The present inventions relates to probes. More specifically, the present invention relates to high frequency electronic probes which are particularly well suited for nondestructive probing of devices having a high density I/O interface or connector.

In the testing of large systems during the initial bring up and including debugging of system hardware, special modifications are typically made to the product. A metal stiffener used to support the large system boards is machined so that an open access is provided to e.g., pins of a Multi Chip Module (MCM) as well as providing access to other points of interest. There are presently two methods used to measure system operations; destructive and nondestructive measurement techniques. These are accomplished either by direct soldering of probe connectors to the system board or by the use of an insulated template and probe arrangement. The first method, direct soldering, provides good high frequency measurements but has many limitations and disadvantages. These limitations and disadvantages include, for example, the requirement that the board must be removed from the test fixture each time a connection is to be soldered on, the number of connections present at any time is limited and the connections are susceptible to mechanical failure (e.g., such as being broken off). The second method, utilizing the probe template, offers a full range of interconnections, by means of holes drilled through a template made of an insulating material, at all signal locations as well as selected ground or voltage reference locations of the MCM. This arrangement is limited to measurements in the 500 MHZ bandwidth region. Thus, while this template arrangement is adequate for error injection and some mid-frequency a.c. measurements, it is not suitable for analysis of high frequency switching noise and circuit operation verification.

With the ever increasing of operational speeds of computer systems including mainframes, it becomes more and more difficult to provide accurate measurement of high frequency operational parameters such as switching noise, signal integrity, jitter measurements, measurements of differential signals, or of differential measurements of voltage to ground disturbances.

SUMMARY OF THE INVENTION

The above-discussed and other drawbacks and deficiencies of the prior art are overcome or alleviated by the high frequency electronic probe of the present invention. The high frequency electronic probe of the present invention is particularly well suited for use with a high density I/O interface such as a template to aid in probing the pin interface of a Multi Chip Module (MCM) on a system board. A system board has a metal stiffener (or other such structure) mounted thereon with an opening in the stiffener to provide access to an area of interest on the system board (e.g., the pins of the MCM). A probe test assembly (template) is positioned at the opening and secured to the stiffener when testing (probing) is desired to provide access to the pins of the MCM. A cover is positioned at the opening and secured to the stiffener at all other times.

The probe test assembly in one embodiment (high frequency testing applications) comprises an insulated pattern guide plate (or template) and a metal (conductive) probe plate which are positioned at the opening and secured to the stiffener by an insulated frame. The insulated frame protects ground pins in the probe plate from being exposed. The plates have a pattern or array of holes corresponding to the pattern of pins on the MCM. The insulated pattern plate insulates the metal probe plate from a probe. In high frequency applications the metal probe plate is part of the measurement system. The metal probe plate has resilient ground terminals (pins) pressed into selected holes therein which provide a low impedance ground return path for test measurements. For low bandwidth or d.c. testing applications the pattern plate is eliminated and the probe plate is comprised of an insulation material, whereby the probe plate does not form part of the aforementioned ground return path. Since the probe plate in this alternate embodiment is non-conductive a ground pin is not provided.

The probe in accordance with one embodiment of the present invention comprises a single ended, high frequency, resilient probe, i.e., a probe having measurement capability in the 3–9 Ghz range, which is particularly well suited for nondestructive probing of devices having a high density I/O interface or connector (such as the probe test assembly). More specifically, the probe comprises a probe body (unit) having a coaxial resilient double ended probe element attached thereto by an adaptor. A locking pin is attached to the probe adaptor and extends parallel to the probe element, however, it is slightly shorter as the locking pin should not contact any pins of the MCM when the probe is used. The locking pin serves to hold the probe on the probe test assembly. A hook is preferably provided at the distal end of the locking pin. Upon insertion of the probe element into a hole of the pattern and probe plates the locking pin will be inserted into an adjacent such hole and the hook will engage a surface of the probe plate, thereby locking the probe. The probe is unlocked by rotating the probe thereby causing the hook to release from the surface of the probe plate. For low frequency probing applications (including d.c.), two such probes are required, a signal probe and a ground probe which are connected to provide a return ground path.

In accordance with another embodiment of the present invention, a differential probe is utilized when measurement of two points that are close together, as well as being at a variable pitch from each other, is desired, at the same time. The differential probe is also well suited for high frequency (e.g., 3–9 Ghz range) nondestructive probing of devices having a high density I/O interface or connector (such as the probe test assembly). More specifically, the differential probe comprises a base having a first pair of opposing spring steel plates and a second adjacent pair of opposing spring steel plates connected thereto. The first pair of spring plates are also connected to a first probe adaptor and the second pair of spring plates are also connected to a second probe adaptor. A first probe body is mounted at an angle to the first adaptor and a second probe body is mounted at an angle to the second adaptor. A first coaxial resilient double ended probe element connected to the first probe body by the first adaptor and a second coaxial resilient double ended probe element connected to the second probe body by the second adaptor. The use of distinct first and second adaptors and corresponding spring plate pairs provides for lateral and independent movement of each of the first and second probe elements. This embodiment of the present invention provides a unique variable pitch differential measurement system, which can be used for differential measurements or to permit two single ended probes of similar or different types to be close to each other.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 3 is a perspective view of the cover of FIG. 2;

FIG. 5 is a partial enlarged perspective view of the probe test assembly of FIG. 4 with a system board;

FIG. 6 is an exploded perspective view of the probe test assembly in accordance with another embodiment;

FIG. 7 is a perspective view of the probe assemblies in accordance with an embodiment of the present invention.

DESCRIPTION OF THE PREFERRED EMBODIMENT

Figure 1:
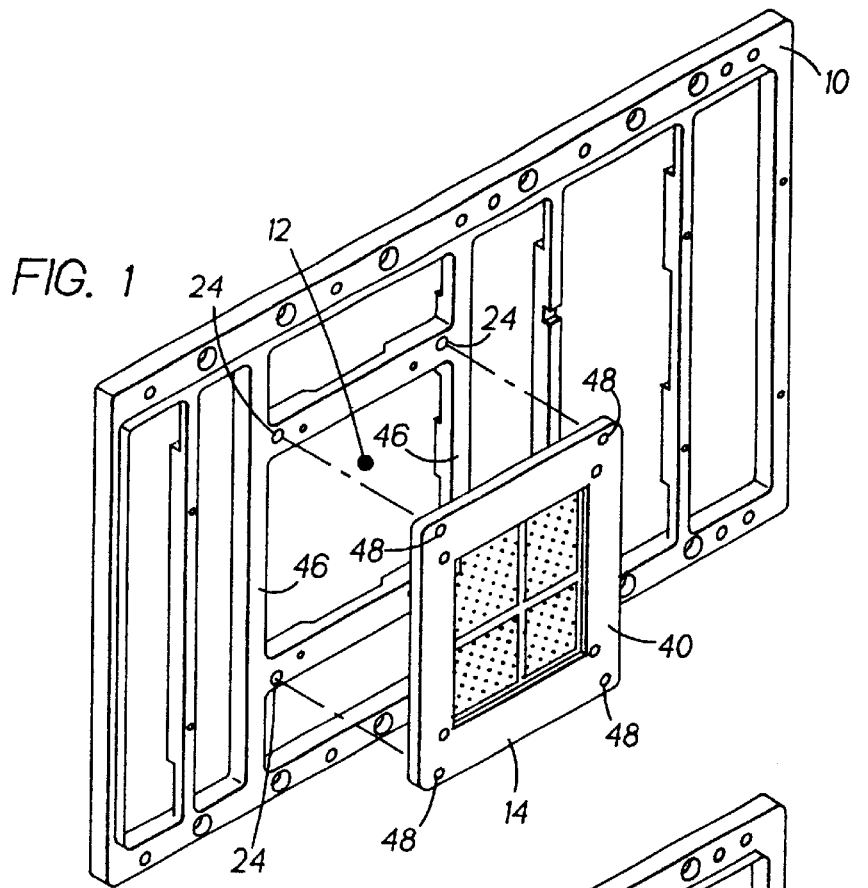
FIG. 1 is an exploded perspective view of a stiffener with a probe test assembly.
Figure 2:
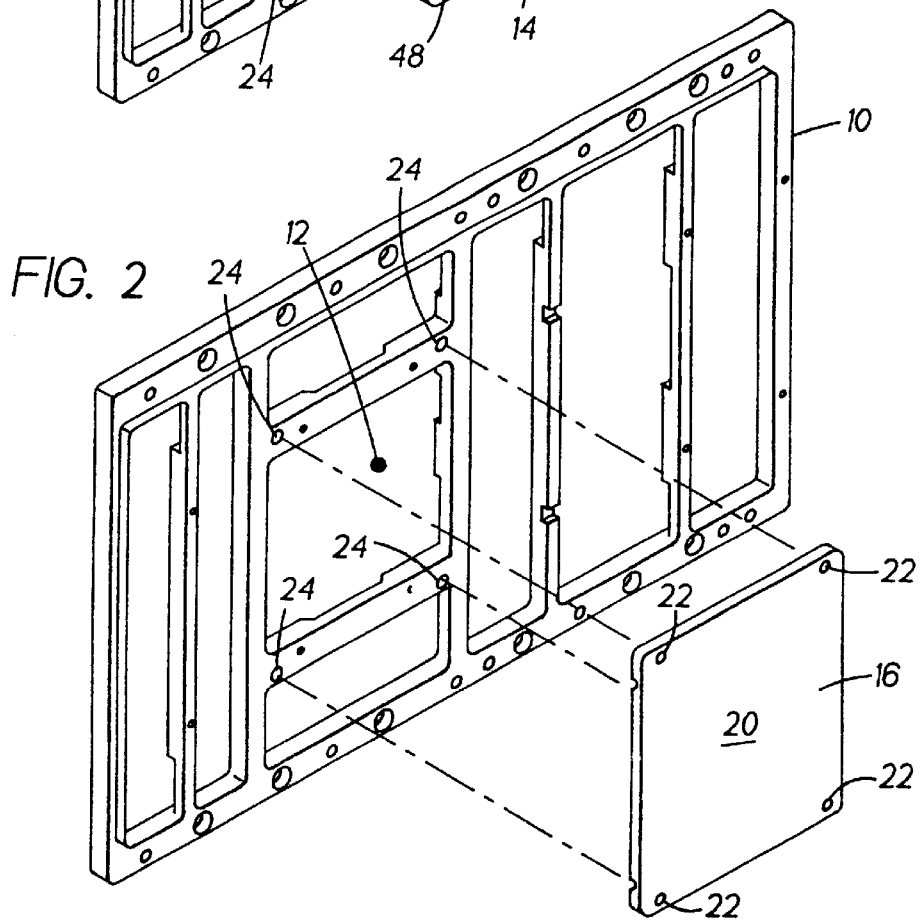
FIG. 2 is an exploded perspective view of a stiffener with a cover.

Referring to FIGS. 1 and 2, a metal stiffener 10 used to support a large system board 11 (FIG. 5) has an opening 12 defined (e.g., machined) therein. The opening is also referred to herein as a manhole. The use of a metal stiffener (or other supporting structure) to support a large system board is well known. The opening 12 in the stiffener 10 is located to provide access to an area of interest on the large system board 11, such as the pin side of a Multi Chip Module (MCM), not shown, which is referred to herein as a Device Under Test (DUT). A probe test assembly 14 (FIG. 1) is positioned at the opening 12 when testing is desired, thereby providing access to the pins of the MCM (i.e., the DUT), as is described hereinafter. A cover 16 (FIG. 2), referred to herein as a manhole cover, is positioned at the opening 12 at all other times to cover the pins of the MCM, thereby serving to protect the pins of the MCM. The cover and the probe test assembly are the subject of a related application entitled Method and Apparatus of Interconnecting with a System Board, U.S. application Ser. No. 09/143,228, filed concurrently herewith, which is incorporated by reference in its entirety.

Referring now to FIGS. 2 and 3, the cover 16 has opposing surfaces 18, 20 with the surface 18 facing the stiffener 10. The cover 16 has four mounting holes 22 therethrough which align with a plurality of mounting holes 24 in the stiffener 10. The cover 16 is secured onto the stiffener 10 by screws (or other suitable fastening means), not shown, through these mounting holes. A channel 26 is provided about the periphery of the cover 16 in the surface 18. Electromagnetic Control (EMC) shielding between the cover 16 and the MCM is provided by a compressible EMC gasket 30 mounted in the channel 26 When the cover 16 is mounted by the screws to the stiffener 10 the gasket 30 is compressed and the effects of EMC noise scattering are minimized. The cover 16 is preferably comprised of the same material as the stiffener 10. A plurality of spacers or standoffs 31 are provided at surface 18 to structurally reinforce the system board 11 which may have been weakened by the removal of material in the stiffener 10 when the opening 12 was provided.

Figure 4:
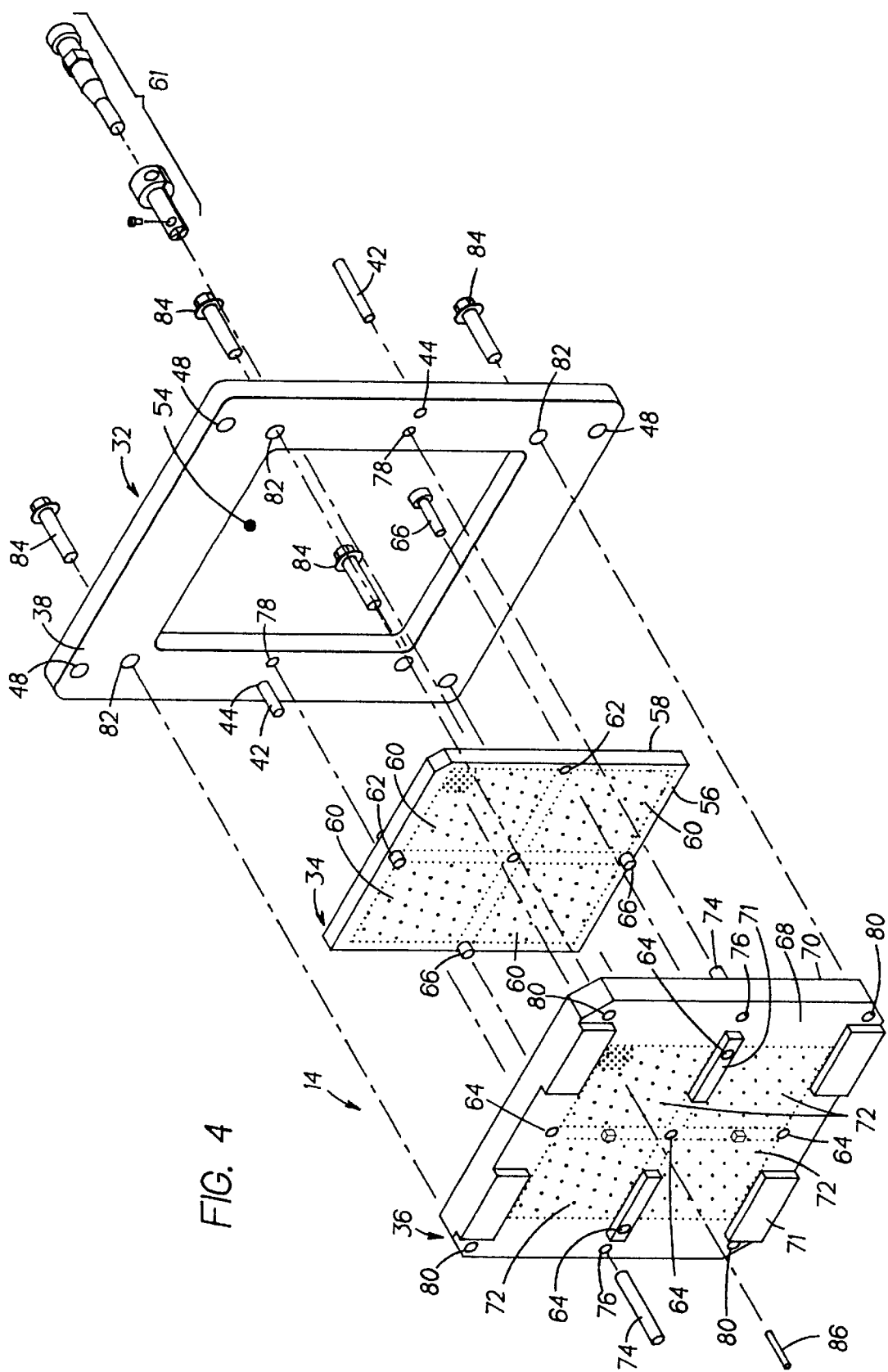
FIG. 4 is an exploded perspective view of the probe test assembly in accordance with an embodiment.

Referring to FIGS. 4 and 5, the probe test assembly 14 comprises a frame 32, a pattern plate 34 and a probe plate 36. The frame 32 has opposing surfaces 38, 40 (FIG. 1) with the surface 38 facing the stiffener 10. A plurality of alignment pins 42 are mounted in holes 44 of the frame 32 and extend from away from surface 38. The pins 42 are received in corresponding alignment holes 46 (FIG. 1) in the stiffener 10 to correctly position the probe test assembly 14 relative to the pins of the MCM. The frame 32 has four mounting holes 48 therethrough which align with the plurality of mounting holes 24 in the stiffener 10. The probe test assembly 14 is secured onto the stiffener 10 by screws (or other suitable fastening means), not shown, through these mounting holes. The frame 32 has an access opening 54 therein for providing access to the pattern and probe plates 34, 36. The frame 32 is preferably comprised of an insulation material such as FR4, thereby insulating the plate 36 from the stiffener 10. The probe test assembly 14 of this exemplary embodiment is particularly well suited for high frequency measurement applications, as described more fully hereinafter.

The pattern plate 34 has opposing surfaces 56, 58 with the surface 56 facing the probe plate 36. A pattern or array of holes 60 corresponding to the pattern of pins on the MCM (i.e., the DUT) are provided through the plate 34 that provide an insulated guide path for a probe 61. The pattern plate 34 has a plurality holes 62 therethrough which align with a plurality of mounting holes 64 in the probe plate 36. The pattern plate 34 is secured onto the probe plate 36 by screws 66 (or other suitable fastening means) through these mounting holes. The pattern plate 34 is preferably comprised of an insulation material such as FR4. Preferably, the surface 58 includes nomenclature (not shown) indicative of the I/O pins of the MCM inscribed thereon.

The probe plate 36 has opposing surfaces 68, 70 with the surface 68 facing the stiffener 10. A plurality of spacers or standoffs 71 are provide at surface 68 to aid in positioning the probe test assembly 14 relative to the pins of the MCM. A pattern or array of holes 72 also corresponding to the pattern of pins on the MCM (i.e., the DUT) are provided through the plate 36. The pattern of holes 60 in the pattern plate 34 may comprise a full compliment of I/O locations in the probe plate 36, thus providing access to all locations. Alternatively, the pattern of holes 60 in the pattern plate 34 may comprise a limited number of holes suitable for testing applications that required multiple testing of a limited number of signal locations. Such limited testing access would, by design, limit the incidence of probing errors and possibilities of causing a device to cease functioning, especially in an environment where the device was mission critical and could not be stopped. A plurality of alignment pins 74 are mounted in holes 76 of the probe plate 36 and extend away from surface 70. The pins 74 are received in corresponding alignment holes 78 in the frame 32 to position the pattern and probe plates 34, 36 on the frame 32 and ultimately relative to the pins of the MCM. The probe plate 36 has four mounting holes 80 therethrough which align with a plurality of mounting holes 82 in the frame 32. The probe plate 36 is secured onto the frame 32 by screws 84 (or other suitable fastening means) through these mounting holes. In high frequency applications the plate 36 is metal and is part of the measurement system. The metal plate 36 has resilient ground terminals 86 pressed into selected holes 72 which provide a low impedance ground return path for test measurements. These ground terminals (or pins) 86 provide a permanent return path that is uniform and consistent every time the probe test assembly 14 is used. An exemplary ground path is shown by the broken line 87 in FIG. 5 where ground pin 86 contacts a ground pad 88 on the system board 11. The probe 61 is a high frequency probe which is used to access signal points (i.e., pins of the MCM) through the appropriate hole 60, 72, with the signal return path being provided by the close proximity of the ground pins 86. The pattern plate 34 provides a non-conductive mechanical cover of the exposed grounding pins 86 in the metal probe plate 36. As described hereinbefore, plate 36 is insulated from the stiffener IO by the insulating material of the frame 32 to enhance the measurement integrity thereby insuring that the noise generated by other package components are not coupled in the measurements.

Referring now to FIG. 6, an alternate of the probe test assembly is shown. It will be noted that elements common to the above described embodiment are numbered the same, whereby reference should be made thereto for a description thereof. This alternate embodiment is particularly well suited for low bandwidth or d.c. testing applications. This probe test assembly 14' comprises the frame 32 (which is the same as the frame 32 described hereinbefore with reference to FIGS. 4 and 5) and a probe plate 36'. The probe plate 36' is the same as the probe plate 36 described hereinbefore with reference to FIGS. 4 and 5, with the exception that the probe plate 36' is comprised of an insulation material such as FR4, instead of metal, whereby the plate 36' does not in this alternate embodiment form part of the aforementioned ground return path (FIG. 5). Since the probe plate 36' is non-conductive a ground pin is not provided pressed into selected holes 72. The probe 61 shown in this FIGURE is the signal probe only and is used to access signal points through the appropriate hole 72. A ground probe is also required with low frequency probing, as is further described hereinafter.

Referring to FIG. 7, the probe 61 in accordance with the present invention comprises a single ended, high frequency, resilient probe, i.e., a probe having measurement capability in the 3–9 Ghz range, which is particularly well suited for nondestructive probing of devices having a high density I/O interface or connector (such as the probe test assembly described above). More specifically, the probe 61 comprises a probe body (unit) 88, e.g., a Textronix 10:1 (high impedance) or 1:1 (matched impedance) probe body such as P/N 206-0399-00 and 206-0398-00. As is well known, the impedance of the probe body may be variable, whereby the impedance varies with frequency, typically through the use of resistor/capacitor parallel circuit (or an active circuit). A 50 ohm coaxial resilient double ended probe element 90, e.g., P/N 100547-00 from Interconnect Device Inc. is attached by an adaptor 92 to the probe body 88. The probe 61 provides a low inductance return path to ground during probing. The probe element 90 is a coaxial probe element whereby the signal is communicated on a center conductor and the return ground is provided by an outer conductor, with these conductors being separated by an insulating material. More specifically, one end 93 of the probe element 90 is inserted into an opening 94 at a first end 96 of the stepped cylindrical shaped adaptor 92. It is preferred that the length of the probe element 90 extending away from the probe adaptor 92 be maximized, for ease of probing (use). One end 98 of the probe body 88 is inserted into an opening (not shown) at another end 100 of the adaptor 92, such that the end 93 of the probe element 90 is electrically connected (coupled) to the end 98 of the probe body 88. The probe element 90 and the probe body 88 are retained in electrical contact and are physically retained within the adaptor 92 by a pair of screws 102 which are received in threaded mounting holes 104 in the adaptor 92. The electrical interconnection of the probe element 90 and the probe body 88 is preferably impedance matched to achieve a low signal-to-noise ratio at this interface. When the screws 104 are tightened a slot 105 in the adaptor 92 closes on the probe element 90 and the probe body 88, as is clearly shown in the FIGURE.

A locking pin 110 has one end 112 thereof attached to a stepped down portion 114 of the probe adaptor 92, by means of welding or any other suitable method. The locking pin 110 extends parallel to the probe element 90, however, it is slightly shorter as the locking pin 110 should not contact any pins of the MCM when the probe 61 is used. The locking pin 110 serves to hold the probe 61 on the probe test assembly 14 (or other such high density I/O interface or connector), thereby also insuring electrical contact. The locking pin 110 is preferably comprised of a spring steel. A hook 116 is preferably provided at an end 118 of the locking pin 110. Upon insertion of the probe element 90 into a hole 60, 72 of the pattern and probe plates 34, 36 the locking pin 110 will be inserted into an adjacent hole 60, 72 of the pattern and probe plates 34, 36 and the hook 116 will engage surface 68 of the probe plate 36, as is shown in FIG. 5, thereby locking the probe 61. The locking pin 110 works best when the distance between the probe element 90 and the locking pin 110 is slightly greater than the distance between adjacent holes 60, 72 in the pattern and probe plates 34, 36. The probe 61 is unlocked by rotating the probe 61 thereby causing the hook 116 to release from the surface 68 of the probe plate 36.

A coaxial cable 119 is connected to another end of the probe body 88 by a coaxial connecter 120, as is well known. The other end of this cable 119 is connected to desired testing apparatus for measuring, recording or analyzing the signal as dictated by the particular test application. As state before, this probe 61 permits nondestructive measurements in the 3–9 Ghz range with very little disturbance to the signal under investigation, due primarily to the short return ground paths provided by the ground pins 86, the metal probe plate 36 and the outer conductor of the probe element 90.

In the low frequency (including d.c.) probe embodiment (as described in the embodiment of FIG. 6), two probes are required, the probe 61, described above for measurement (i.e., the signal probe) and a second probe 61' for ground connection. The second probe 61' is of the same type as the measurement probe 61. A wire 122 having resilient connections 124 at each end thereof electrically interconnects these probes to provide the return ground path. A shorting plug 125 is connected to the other end of the probe body 88 of probe 61' to short the ground connection provided by the probe 61' to the probe body 88 of probe 61', thereby completing the ground circuit when wire 122 is connected. Accordingly, the probe 61 would be connected to the pin of the MCM to be measured and the probe 61' would be connected to a ground pin of the MCM.

Figure 8:
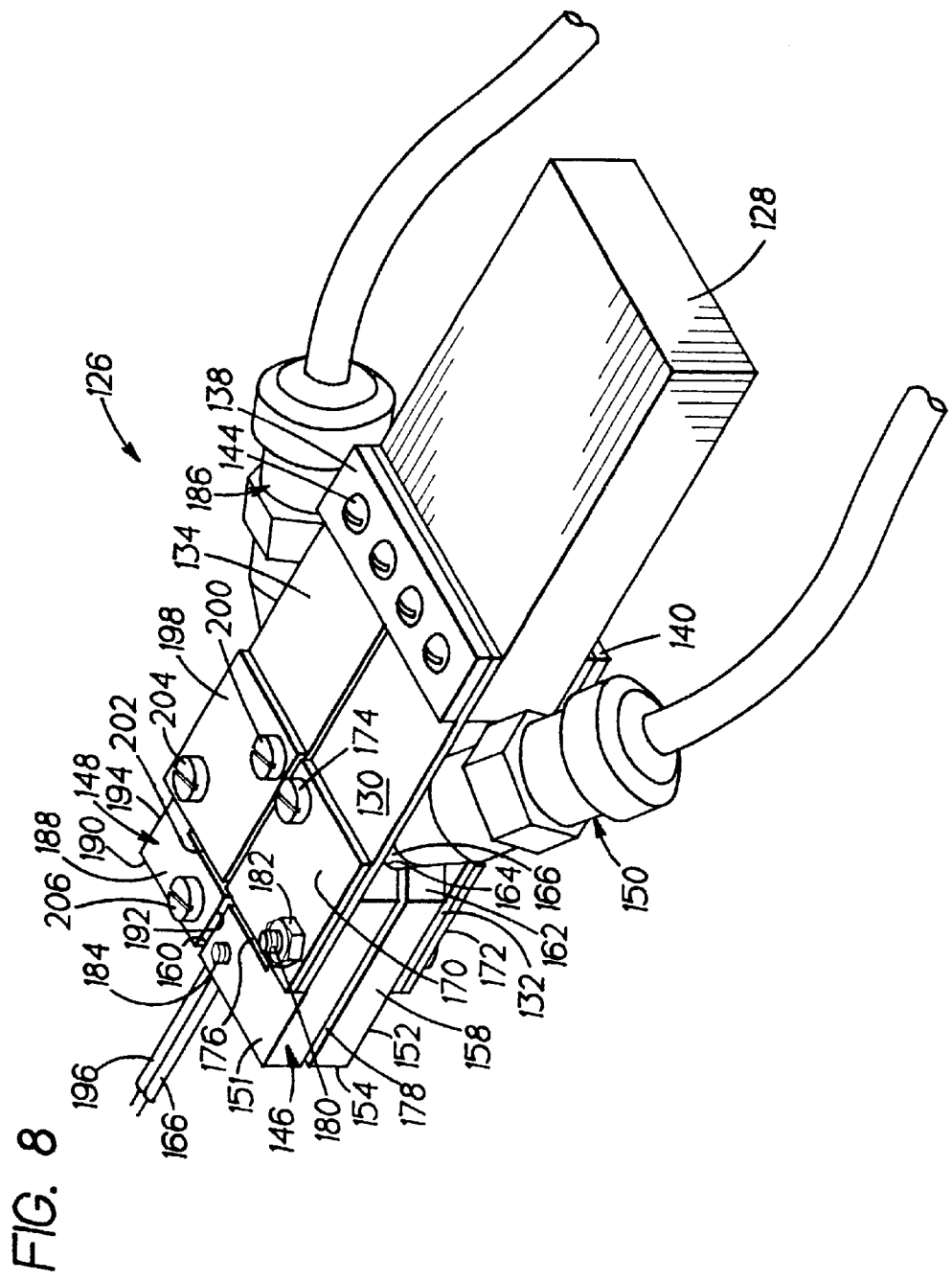
FIG. 8 is a perspective view of a differential probe assembly in accordance with another embodiment of the present invention.

Referring to FIG. 8, a differential probe 126 is utilized when measurement of two points that are close together, as well as being at a variable pitch from each other, is desired, at the same time. The probe 126 in accordance with this alternate embodiment is also well suited for high frequency (e.g., 3–9 Ghz range) nondestructive probing of devices having a high density I/O interface or connector (such as the probe test assembly described above). More specifically, the probe 126 comprises a base 128 for providing a means to grip or hold the probe 126. The base 128 in the present example comprises a solid generally rectangular block of suitable insulting material, e.g., plastic. A first pair of opposing spring steel plates 130, 132 and a second adjacent pair of opposing spring steel plates 134, (not shown) are each connected at one end thereof to the base 128 by headers 138, 140 and screws 144. The other end of the first pair of plates 130, 132 are connected to a first probe adaptor 146. The other end of the second pair of plates 134, (not shown) are connected to a second probe adaptor 148. A first probe body 150, e.g., a Textronix 10:1 (high impedance) or 1:1 (matched impedance) probe body (unit) such as P/N 206-0399-00 and 206-0398-00 is mounted at an angle to the first adaptor 146. As is well known, the impedance of the probe body may be variable, whereby the impedance varies with frequency, typically through the use of resistor/capacitor parallel circuit (or an active circuit). The first adaptor 146 is generally a rectangular block having upper and lower surfaces 151, 152, end surfaces 154, (not shown) and side surfaces 158, 160. A corner 162 between the end (not shown) and the side surface 158 is cut at an angle where an opening 164 is provided for receiving one end of the first probe body 150. A first 50 ohm coaxial resilient double ended probe element 166, e.g., P/N 100547-00 from Interconnect Device Inc., has one end thereof inserted into an opening (not shown) at the end 154 of the first adaptor 146. The probe element 166 is a coaxial probe element whereby the signal is communicating on a center conductor and the return ground is provided by an outer conductor, with these conductors being separated by an insulating material. It is preferred that the length of the probe element extending away from the first adaptor 146 be maximized, for ease of probing (use). The opening (not shown) for the probe element 166 and the opening 164 in the first adaptor 146 are oriented to provide electrical interconnection (coupling) of the first probe body 150 and the first probe element 166 within the first adapter 146. The electrical interconnection of the probe element 166 and the probe body 150 is preferably impedance matched to achieve a low signal-to-noise ratio at this interface. The first probe element 166 and the first probe body 150 are maintained in electrical contact and are physically retained within the first adaptor 146 as follows.

A plate 170 is located at the upper surface 151 of the first adaptor 146 with the spring plate 130 disposed therebetween. A plate 172 is located at the lower surface 152 of the first adaptor 146 with the spring plate 132 disposed therebetween. A treaded screw 174 is inserted through a hole in the plates 170, 172, the spring plates 130,132 and the first adaptor 146 and has a nut (not shown) attached thereto for connecting the spring plates 130, 132 to the first adaptor 146. Relief slots 176 are cut in the upper and lower surfaces 151, 152 of the first adaptor at the distal ends of the spring plates 130, 132. A slot 178 is cut along the end 154, the side 158, extends along corner 162 and ends at the opening 164. A treaded screw 180 is inserted through a hole in the plates 170, 172, the spring plates 130,132 and the first adaptor 146 and has a nut 182 attached thereto, which are tightened to close the slot 178 (at the side 158 near the corner 162) and thereby the first adaptor 146 in on the first probe body 150 for securing the first probe body 150 to the first adaptor 146. The screw 180 and nut 182 also serve to retain the spring plates 130, 132 through the plates 170, 172 to the first adaptor 146. A treaded screw 184 is inserted through a hole in the first adaptor 146. This hole is threaded at one end thereof such that when the screw 184 is tightened the slot 178 (at the end 154), and thereby the first adaptor 146, closes in on the first probe element body 166 for securing the first probe element 166 to the first adaptor 146.

A second probe body (unit) 186, e.g., a Textronix 10:1 (high impedance) or 1:1 (matched impedance) probe body such as P/N 206-0399-00 and 206-0398-00 is mounted at an angle to the second adaptor 148. As is well known, the impedance of the probe body may be variable, whereby the impedance varies with frequency, typically through the use of resistor/capacitor parallel circuit (or an active circuit). The second adaptor 148 is generally a rectangular block having upper and lower surfaces 188, (not shown), end surfaces 190, (not shown) and side surfaces 192, 194. A corner (not shown) between the end (not shown) and the side surfaces 194 is cut at an angle where an opening (not shown) is provided for receiving one end of the second probe body 186. A second 50 ohm coaxial resilient double ended probe element 196, e.g., P/N 100547-00 from Interconnect Device Inc., has one end thereof inserted into an opening (not shown) at the end 190 of the second adaptor 148. The probe element 196 is a coaxial probe element whereby the signal is communicated on a center conductor and the return ground is provided by an outer conductor, with these conductors being separated by an insulating material. It is preferred that the length of the probe element extending away from the second adaptor 148 be maximized, for ease of probing (use). The openings (not shown) for the probe element 196 and the probe body 186 in the second adapter 148 are oriented to provide electrical interconnection (coupling) of the second probe body 186 and the second probe element 196 within the second adapter 148. The electrical interconnection of the probe element 196 and the probe body 186 is preferably impedance matched to achieve a low signal-to-noise ratio at this interface. The second probe element 196 and the second probe body 186 are maintained in electrical contact and are physically retained within the second adaptor 186 as follows.

A plate 198 is located at the upper surface 188 of the second adaptor 148 with the spring plate 134 disposed therebetween. An opposing plate (not shown) is located at the lower surface (not shown) of the second adaptor 148 with the lower spring plate (not shown) disposed therebetween. A treaded screw 200 is inserted through a hole in the opposing plates 170, (not shown), the opposing spring plates 134, (not shown) and the second adaptor 148 and has a nut (not shown) attached thereto for connecting the opposing spring plates 134, (not shown) to the second adaptor 148. Relief slots 202 are cut in the upper and lower surfaces 188, (not shown) of the second adaptor 148 at the distal ends of the opposing spring plates 134, (not shown). A slot (not shown) is cut along the end 190, the side 194, extends along the corner (not shown) and ends at the opening at the corner. A treaded screw 204 is inserted through a hole in the opposing plates 198, (not shown), the opposing spring plates 134, (not shown) and the second adaptor 148 and has a nut (not shown) attached thereto, which are tightened to close this slot (at the side 194 near the corner, not shown) and thereby the second adaptor 148 in on the second probe body 186 for securing the second probe body 186 to the second adaptor 148. The screw 204 and nut (not shown) also serve to retain the spring plates 134, (not shown) through the plates 198, (not shown) to the second adaptor 148. A treaded screw 206 is inserted through a hole in the second adaptor 148. This hole is threaded at one end thereof such that when the screw 206 is tightened the slot (not shown, at the end 190) and thereby the second adaptor 148 closes in on the second probe element body 196 for securing the second probe element 196 to the second adaptor 148. It will be appreciated that the second adapter 148 is a mirror image of the first adapter 146.

The use of distinct adaptors 146, 148 and corresponding spring plate pairs 130, 132 and 134, (not shown) provides for lateral and independent movement of each probe element 166, 196. The probe elements 166, 196 of this embodiment are arranged in a manner such that the coaxial probe elements 166, 196 are in close proximity to each other. This embodiment of the present invention provides a unique variable pitch differential measurement system, which can be used for differential measurements or to permit two single ended probes of similar or different types to be close to each other and to be displaced relative to each other. In a preferred embodiment of the present invention the return force of the spring plate pairs 130, 132 and 134, (not shown) will hold the probes elements 166, 196 securely in, e.g., the aforementioned test probe assembly. Alternatively, the probe element distance can be otherwise mechanically maintained by, for example, an adjustment screw mechanism.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical probe apparatus for establishing a non-destructive measurable electrical contact with an electrical device mounted on a test fixture, comprising:

a probe unit having first and second ends, said first end of said probe unit adapted for connection to an external apparatus;

a probe element having first and second ends, said first end of said probe element for connection to a point to be probed of the electrical device, wherein during probing said probe element provides a low inductance ground return path;

an adapter having a first opening receiving said second end of said probe unit and a second opening receiving said second end of said probe element, said first and second openings in said adapter are configured to provide electrical interconnection of said second ends of said probe unit and said probe element; and a locking pin disposed at said adapter and extending parallel to said probe element, said locking pin securing said electrical probe apparatus to said test fixture, said locking pin extends from said adapter a lesser distance than said probe element extends from said probe adapter, and said locking pin includes a hook defined at a distal end of said locking pin.

2. The electrical probe apparatus of claim 1 wherein said probe element comprises a coaxial resilient double ended probe element.

3. The electrical probe apparatus of claim 1 wherein said probe unit comprises a high impedance probe unit.

4. The electrical probe apparatus of claim 1 wherein said probe unit comprises a variable impedance probe unit.

5. The electrical probe apparatus of claim 1 wherein said probe unit and said probe element are impedance matched.

6. The electrical probe apparatus of claim 1 wherein said probe unit comprises a matched impedance probe unit.

7. The electrical probe apparatus of claim 1 wherein the electrical device has a high density I/O interface.

8. The electrical probe apparatus of claim 1 wherein said adapter further comprises:

a stepped generally cylindrical shaped adapter having a longitudinal slot defined therein which extends to said first and second openings; and a device for at least partially closing said slot, whereby said first and second openings close in on said probe unit and said probe element to maintain the electrical interconnection of said second ends of said probe unit and said probe element and to retain said probe unit and said probe element at said adapter.

9. The electrical probe apparatus of claim 8 wherein said device for at least partially closing said slot comprises a threaded member which is engaged in a threaded opening in said adapter at said slot.

10. The electrical probe apparatus of claim 1 wherein said locking pin is comprised of a resilient material for providing a retention force.

11. The electrical probe apparatus of claim 10 wherein said resilient material comprises spring steel.

* * * * *